(12) United States Patent
Priewasser

(10) Patent No.: US 10,032,669 B2
(45) Date of Patent: Jul. 24, 2018

(54) WAFER DIVIDING METHOD

(71) Applicant: DISCO CORPORATION, Tokyo (JP)

(72) Inventor: Karl Heinz Priewasser, Munich (DE)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 15/051,755

(22) Filed: Feb. 24, 2016

(65) Prior Publication Data
US 2016/0254188 A1 Sep. 1, 2016

(30) Foreign Application Priority Data

Feb. 27, 2015 (DE) .................. 10 2015 002 542

(51) Int. Cl.
H01L 21/78 (2006.01)
H01L 21/268 (2006.01)
(Continued)

(52) U.S. Cl.
CPC ............ *H01L 21/78* (2013.01); *H01L 21/268* (2013.01); *H01L 21/3065* (2013.01); *H01L 21/561* (2013.01); *H01L 21/6835* (2013.01); *H01L 21/6836* (2013.01); *H01L 24/92* (2013.01); H01L 21/568 (2013.01); H01L 23/3114 (2013.01); H01L 23/544 (2013.01); H01L 24/94 (2013.01); H01L 2221/6834 (2013.01); H01L 2221/68318 (2013.01);
(Continued)

(58) Field of Classification Search
None
See application file for complete search history.

(56) References Cited

U.S. PATENT DOCUMENTS 9,076,860 B1* 7/2015 Lei .................... H01L 21/67092
2004/0242003 A1 12/2004 Murayama
(Continued)

FOREIGN PATENT DOCUMENTS

CN 103295948 A 9/2013
CN 104009000 A 8/2014
(Continued)

OTHER PUBLICATIONS

Examination report issued by the Japanese Patent Office in corresponding Japanese patent application No. 2016-024964, dated Jan. 31, 2017 (with translation).
(Continued)

*Primary Examiner* — Khaja Ahmad
(74) *Attorney, Agent, or Firm* — Greer Burns & Crain Ltd.

(57) ABSTRACT

A wafer having on one side a device area with devices partitioned by division lines is divided into dies. An adhesive tape for protecting the devices is attached to the one side of the wafer, and a carrier for supporting the adhesive tape is attached to the outside of the adhesive tape. The other side of the wafer is ground to adjust the wafer thickness, and a protective layer is applied to the ground side of the wafer. The side of the wafer opposite to the adhesive tape is mechanically partially cut along the division lines with a first cutting width. A remaining part of the wafer, in the thickness direction thereof in the region or regions where the partial cut or cuts had been formed, is cut with a second cutting width. The second cutting width is smaller than or equal to the first cutting width.

20 Claims, 5 Drawing Sheets

(51) Int. Cl.
  *H01L 21/3065* (2006.01)
  *H01L 21/56* (2006.01)
  *H01L 21/683* (2006.01)
  *H01L 23/00* (2006.01)
  *H01L 23/31* (2006.01)
  *H01L 23/544* (2006.01)

(52) U.S. Cl.
  CPC ............... *H01L 2221/68327* (2013.01); *H01L 2221/68381* (2013.01); *H01L 2223/54486* (2013.01); *H01L 2224/92* (2013.01); *H01L 2224/94* (2013.01); *H01L 2924/35121* (2013.01)

(56) References Cited

U.S. PATENT DOCUMENTS

| | | | |
|---|---|---|---|
| 2006/0040472 A1 | 2/2006 | Tamura et al. | |
| 2007/0155049 A1* | 7/2007 | Tsai | H01L 21/561 438/106 |
| 2008/0047408 A1* | 2/2008 | Oba | H01L 21/78 83/39 |
| 2009/0197395 A1* | 8/2009 | Nakamura | B23K 26/0853 438/463 |
| 2009/0243097 A1 | 10/2009 | Koroku et al. | |
| 2009/0294913 A1 | 12/2009 | Kawashima | |
| 2010/0003119 A1* | 1/2010 | Nakamura | H01L 21/67132 414/800 |
| 2010/0003771 A1* | 1/2010 | Nagai | H01L 21/67092 438/15 |
| 2010/0048001 A1* | 2/2010 | Harikai | H01J 37/32743 438/464 |
| 2010/0255657 A1* | 10/2010 | Priewasser | H01L 21/3043 438/462 |
| 2012/0193014 A1 | 8/2012 | Knickerbocker et al. | |
| 2013/0023107 A1 | 1/2013 | Martin et al. | |
| 2013/0037917 A1 | 2/2013 | Xue | |
| 2013/0037935 A1* | 2/2013 | Xue | H01L 21/76898 257/737 |
| 2013/0230966 A1* | 9/2013 | Martin | H01L 21/67092 438/458 |
| 2013/0330855 A1* | 12/2013 | Sekiya | H01L 33/60 438/27 |
| 2014/0080287 A1* | 3/2014 | Zull | H01L 31/18 438/463 |
| 2014/0099777 A1 | 4/2014 | Mackh et al. | |
| 2014/0318697 A1 | 10/2014 | Tan et al. | |

FOREIGN PATENT DOCUMENTS

| | | |
|---|---|---|
| JP | 2004-031526 A | 1/2004 |
| JP | 2005-175207 A | 6/2005 |
| JP | 2008-159985 A | 7/2008 |
| JP | 2009-182178 A | 8/2009 |
| JP | 2010-027997 A | 2/2010 |
| JP | 2011-181864 | 9/2011 |
| JP | 2013-026614 A | 2/2013 |
| JP | 2013-183157 A | 9/2013 |
| JP | 2013-258234 A | 12/2013 |
| JP | 2014-157909 A | 8/2014 |
| JP | 2014-165246 A | 9/2014 |
| JP | 2014236152 | 12/2014 |
| KR | 10-2009-0107511 A | 10/2009 |
| TW | 200830392 A | 7/2008 |

OTHER PUBLICATIONS

Office action issued in corresponding Korean patent application KR 10-2016-0023095, dated Jan. 3, 2017 (with translation).
Notice of Allowance issued by the Korean Intellectual Property Office for KR Application No. 10-2016-0023095, dated Sep. 22, 2017 (with partial English language translation).
Office Action issued by the State Intellectual Property Office of China for corresponding CN Patent Application No. 201610109044.7, dated Feb. 11, 2018.

* cited by examiner

WAFER DIVIDING METHOD

TECHNICAL FIELD

The present invention relates to a method of dividing a wafer, such as a semiconductor wafer, having on one side a device area with a plurality of devices partitioned by a plurality of division lines, into dies.

TECHNICAL BACKGROUND

In a semiconductor device fabrication process, a wafer having a device area with a plurality of devices partitioned by a plurality of division lines is divided into individual dies. This fabrication process generally comprises a grinding step for adjusting the wafer thickness and a cutting step of cutting the wafer along the division lines to obtain the individual dies. In order to protect the devices formed on the wafer during this fabrication process and to suitably position the individual dies, an adhesive tape can be attached to the side of the wafer having the devices formed. thereon.

In known semiconductor device fabrication processes, such as flip chip packaging, Wafer Level Chip Scale Package (WLCSP) and Embedded Wafer Level Ball Grid Array (eWLB), the cutting step referred to above is performed from the front side of the wafer on which the devices are formed. In this cutting process, a surface layer, such as a low-k layer (i.e., a layer with low dielectric constant), formed on the wafer front side is first removed along the division lines by laser grooving. Subsequently, the wafer is fully cut along the resulting laser grooves by blade dicing from the front side of the wafer.

The grooves formed by this laser grooving process need to have a sufficient width for allowing the cutting blade to safely pass therethrough in the subsequent blade dicing step without damaging the remaining surface layer. Hence, the laser groove width is chosen to be significantly larger than the cutting width in the blade dicing process. This requirement of a relatively large laser groove width results in a wider spacing between neighbouring devices and thus limits the number of devices which can be arranged on the wafer, i.e., the packing density. Further, multiple laser passes are necessary to provide such a wide laser groove, thereby rendering the laser grooving process time-consuming and inefficient.

Therefore, the throughput of processed devices per hour is reduced and the productivity is lowered.

Moreover, due to the heat generated in the laser grooving process, the remainder of the surface layer, such as the low-k layer, formed on the front side of the wafer may at least partly delaminate, causing damage to the devices and/or the wafer substrate. Such damage may not only affect the functionality of the devices but also reduce the die strength of the resulting device chips.

Hence, there remains a need for a time- and cost-efficient wafer dividing method which allows for any risk of damage to the wafer to be minimised.

SUMMARY OF THE INVENTION

Accordingly, it is an object of the present invention to provide a time- and cost-efficient method of dividing a wafer into dies which allows for any risk of damage to the wafer to be minimised. This goal is achieved by a wafer dividing method with the technical features of claim 1. Preferred embodiments of the invention follow from the dependent claims.

The invention provides a method of dividing a wafer, having on one side a device area with a plurality of devices partitioned by a plurality of division lines, into dies. The method comprises attaching an adhesive tape for protecting devices on the wafer to the one side of the wafer, attaching a carrier for supporting the adhesive tape to the side of the adhesive tape being opposite to the side facing the one side of the wafer by an attachment means and grinding the side of the wafer being opposite to the one side for adjusting the wafer thickness. The method further comprises applying a protective layer to the side of the wafer being opposite to the one side after grinding and cutting the wafer along the division lines. In this cutting process, the side of the wafer being opposite to the one side is mechanically partially cut with a first cutting width, and a remaining part of the wafer, in the thickness direction thereof in the region or regions where the partial cut or cuts had been formed, is mechanically cut and/or cut by laser and/or cut by plasma from the side of the wafer being opposite to the one side with a second cutting width. The second cutting width is smaller than or equal to the first cutting width.

In the step of mechanically partially cutting the side of the wafer being opposite to the one side, the side of the wafer being opposite to the one side is mechanically partially cut in the thickness direction of the wafer, i.e., along part of the thickness of the wafer.

According to the wafer dividing method of the present invention, the wafer is cut along the division lines from the side of the wafer being opposite to the one side, i.e., from the backside of the wafer on which the devices are not formed. Specifically, the wafer backside is mechanically partially cut with a first cutting width and a remaining part of the wafer is mechanically cut and/or cut by laser and/or cut by plasma from the backside with a second cutting width, the second cutting width being smaller than or equal to the first cutting width.

Hence, no laser grooving on the wafer front side with a groove width which is larger than the cutting width in the mechanical cutting process is required. Therefore, the spacing between adjacent devices in the device area can be reduced, thus increasing the number of devices which can be arranged on the wafer, resulting in an improved packing density.

Thus, the throughput of processed devices per hour can be increased and the productivity can be enhanced, so that a time- and cost-efficient wafer dividing method is achieved.

Also, since the wafer is cut along the division lines from the backside thereof, no damage to the wafer front side, such as delamination of a surface layer (e.g., a low-k layer) formed thereon, occurs. Hence, any damage to the devices and/or the wafer substrate can be reliably prevented, allowing for robust device chips with a high die strength to be obtained.

Moreover, if the remaining part of the wafer is cut by laser, the number of laser passes in the cutting process can be significantly reduced, since no laser grooving on the wafer front side with a large groove width is necessary. Thus, the efficiency of the wafer dividing method is further improved.

The remaining part of the wafer may be cut in a single mechanical cutting step, e.g., by blade dicing or sawing, or in a single laser cutting step or in a single plasma cutting step, e.g., by using a plasma source. The remaining part of the wafer may be cut by a sequence of mechanical cutting and/or laser cutting and/or plasma cutting steps. For example, a mechanical cutting step may be followed by a laser cutting step or a plasma cutting step.

In the step of mechanically partially cutting the side of the wafer being opposite to the one side, the wafer may be cut along 50% or more, preferably along 70% or more, more preferably along 80% or more and even more preferably along 90% or more, of its thickness.

In a particularly preferred embodiment of the method of the invention, the second cutting width is smaller than the first cutting width.

As has been detailed above, the wafer is cut along the division lines from the backside of the wafer on which the devices are not formed. Therefore, the first cutting width in the step of mechanically partially cutting the wafer backside does not affect the required spacing of the devices which are formed on the opposite side of the wafer, i.e., the front side thereof.

Further, in the method according to this preferred embodiment, a remaining part of the wafer in the thickness direction thereof is cut with a second cutting width which is smaller than the first cutting width. Hence, the device area on the one side, i.e., the front side, of the wafer is cut from the wafer backside with a reduced cutting width. The method of this preferred embodiment of the invention thus allows for the spacing between neighbouring devices in the device area to be further reduced, resulting in an additional increase of the packing density of the devices.

In this way, the throughput of processed devices per hour and the productivity can be further enhanced.

Also, if the remaining part of the wafer is cut by laser, the number of laser passes can be further reduced, due to the reduced second cutting width, thus further improving the efficiency of the wafer dividing method. In particular, in this case, a single laser pass is sufficient for the cutting process.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The adhesive tape may adhere to at least some or all of the devices formed in the device area. Alternatively, the adhesive tape may not adhere to the devices formed in the device area.

The adhesive of the adhesive tape on the side thereof facing the one side of the wafer may be located completely outward of the device area of the wafer in a top view thereon. In this way, it can be reliably ensured that the adhesive does not adhere to the devices formed in the device area. Hence, any damage to the devices when the adhesive tape is peeled off from the wafer can be safely prevented.

The adhesive may be arranged on the side thereof facing the one side of the wafer in an annular shape.

The adhesive of the adhesive tape on the side thereof facing the one side of the wafer may be arranged so as not to extend beyond the peripheral marginal area of the wafer.

The adhesive tape may be formed of a flexible or pliable material. In this case, the tape can deform so as to conform to the devices formed in the device area in a reliable manner, enabling a particularly thin grinding of the wafer in the grinding step.

The adhesive tape may be heat resistant and/or plasma resistant and/or moisture resistant. In this way, it can be ensured that the tape is not damaged in following process steps, such as heat curing or plasma etching, thus providing particularly efficient protection for the devices in the device area.

The wafer may have on the one side a peripheral marginal area with no devices formed around the device area.

The attachment means may be an adhesive layer formed of an adhesive material. The adhesive material may be curable by an external stimulus, such as heat, UV radiation, an electric field and/or a chemical agent. In this way, the carrier can be easily removed from the adhesive tape after processing. The external stimulus may be applied to the adhesive material so as to lower the adhesive force of the material, thus allowing for an easy removal of the carrier.

In particular, the adhesive material may be an acrylic resin or an epoxy resin. A preferred example of a UV curable type resin for the adhesive material is, e.g., urethane acrylate oligomer.

Further, the adhesive material may be, for example, a water soluble resin.

The attachment means may be located completely outward of the device area of the wafer in a top view thereon. Such an arrangement provides the following advantages.

In the process of peeling off the wafer from the carrier, the wafer may be subjected to large bending stresses, which may result in breakage of the wafer and/or damage to the devices formed on the wafer. Due to the bending of the wafer in the detachment process of the carrier, partially separated dies may touch each other and thus be damaged. Further, large bending stresses also act on the carrier upon detachment thereof. The carrier may thus be compromised or even broken in the removal process, rendering its reuse unfeasible. For these reasons, the wafer has to be detached from the carrier very slowly and carefully, leading to a reduction in productivity, i.e., a reduced throughput of processed units per hour, and therefore increased processing costs.

By locating the attachment means completely outward of the device area of the wafer in a top view thereon, the area in which carrier and adhesive tape are attached to each other is significantly reduced. Thus, the carrier can be detached from the wafer more easily and the risk of damage to the wafer or the carrier upon detachment can be minimised.

Further, if the attachment means is treated for allowing easier carrier detachment, the devices are not easily damaged since they are located spaced apart from the area where the attachment means is present.

Moreover, the present inventors found that locating the attachment means completely outward of the device area of the wafer allows for the backside of the wafer to be ground with a particularly high degree of accuracy. In this case, the attachment means functions as a cushion in the grinding process.

The attachment means may be arranged so as not to extend beyond the peripheral marginal area of the wafer.

The attachment means may have an annular shape. Such a shape provides the advantage that a good compromise is achieved between a large enough attachment area for fixing the adhesive tape in place and a sufficiently small attachment area for allowing carrier detachment with minimum risk of damage to the wafer and the carrier. Further, the annular shape allows for a cost-efficient and simple processing of the attachment means. In addition, the annular shape provides a good fixation of the adhesive tape to the carrier so that a die shift can be particularly reliably prevented.

The attachment means may be provided on a flat upper surface of the carrier. Such an arrangement offers a particularly simple structure of the carrier and the attachment means.

The attachment means may have a thickness in the range of 5 to 100 μm.

The attachment means may be received in a recess, preferably an annular recess, formed in the carrier. Such an arrangement allows for integration of the attachment means into the carrier. Thus, a set of wafer and carrier is provided that is easily handleable. Further, in particular, if the carrier is made of a relatively hard and rigid material, the recess can be formed easily with high precision therein. Therefore, the method allows for a good processing quality.

Alternatively, the recess could also be formed in the adhesive tape or in the adhesive tape and the carrier in combination.

The attachment means may be arranged on a peripheral side surface of the carrier and a peripheral side surface of the adhesive tape, e.g., along the entire circumference of the carrier and the adhesive tape. In this case, no portion of the attachment means is present at the interface between carrier and adhesive tape. Hence, a particularly smooth, even and homogeneous interface can be ensured.

The application of the protective layer to the side of the wafer being opposite to the one side may be performed before cutting of the wafer. In this case, the backside of the wafer is particularly reliably protected during the cutting process.

A mechanical cut may be performed along the division lines through the protective layer before being performed through part of the wafer. Thus, the process of mechanically partially cutting the backside of the wafer can be performed in a particularly efficient manner, wherein first the protective layer is mechanically cut, followed immediately by the partial mechanical cutting of the wafer backside in the same cutting step.

The application of the protective layer to the side of the wafer being opposite to the one side may be performed after cutting of the wafer. In this case, the material of the protective layer can penetrate into the cuts between the dies created in the cutting process, in particular, if the protective layer is applied in the form of a liquid mold material. Hence, the protective layer can be applied also to the side surfaces of the dies, thus substantially enclosing the dies, providing particularly reliable protection. For example, this approach can be employed for an Embedded-Wafer Level-Ball-Grid-Array (eWLB)-like device fabrication process.

If the protective layer is applied to the backside of the wafer after cutting of the wafer, the wafer dividing method of the present invention may further comprise cutting the protective, layer along lines at the location where the division lines were located before cutting the wafer. In this way, the dies having the protective layer applied to their backsides and side surfaces are reliably separated from each other.

The wafer dividing method of the present invention may further comprise providing a laser marking on the protective layer.

The wafer dividing method of the present invention may further comprise grinding the side of the wafer being opposite to the one side after application of the protective layer so as to remove the protective layer. In this way, the protective layer can serve to protect the wafer during processing steps, such as cutting or plasma etching, but does not remain in the finished dies. For example, this approach can be employed for a flip chip packaging process, where no protective layer is desired in the finished product.

Removal of the protective layer may be carried out after cutting of the wafer and/or after plasma etching of the wafer.

The protective layer may be heat resistant and/or plasma resistant and/or moisture resistant. In this way, it can be ensured that the protective layer is not damaged in following process steps, such as plasma etching, thus providing particularly efficient protection for the wafer.

The protective layer may be applied in the form of a solid sheet, e.g., an adhesive tape, or in the form of a liquid mold material.

Applying the protective layer in the form of a solid sheet, e.g., an adhesive tape, is a simple approach which allows for a particularly high degree of accuracy and uniformity of the protective layer to be achieved.

As has been detailed above, using a liquid mold material for the protective layer offers the advantage that the material can reliably and efficiently penetrate into the cuts between the dies created in the cutting process, if the material is applied to the backside of the wafer after cutting of the wafer. Hence, the protective layer can be reliably applied also to the side surfaces of the dies, thus providing particularly reliable protection.

The protective layer may be formed of or comprise a material which is curable by an external stimulus, such as heat, UV radiation, an electric field and/or a chemical agent. In particular, the protective layer may be formed of or comprise a thermosetting material and/or an energy ray-curable material.

The wafer dividing method of the invention may further comprise curing the protective layer by the application of the external stimulus.

A surface layer, in particular, a low-k layer, i.e., a layer with a low dielectric constant, may be provided on the one side of the wafer. The surface layer, in particular, the low-k layer, may be mechanically cut and/or cut by laser and/or cut by plasma from the side of the wafer being opposite to the one side.

As has been detailed above, since the wafer is cut along the division lines from the backside thereof, no delamination of the surface layer formed thereon occurs. Hence, any damage to the devices and/or the wafer substrate can be reliably prevented, allowing for robust device chips with a high die strength to be obtained.

The wafer dividing method of the invention can be particularly advantageously used for a wafer having a low-k layer provided on its front side. Low-k layers are generally very brittle and are easily damaged and/or delaminated when cutting the wafer from the front side thereof. However, when dividing such a wafer using the method of the invention, no such damage and/or delamination occurs.

The adhesive of the adhesive tape on the side thereof facing the one side of the wafer may be curable by an external stimulus, such as heat, UV radiation, an electric field and/or a chemical agent in this way, the adhesive tape can be easily removed from the wafer after processing. The external stimulus may be applied to the adhesive of the adhesive tape on the side thereof facing the one side of the wafer so as to lower the adhesive force of the adhesive, thus allowing for an easy removal of the adhesive tape.

In particular, the adhesive may be an acrylic resin or an epoxy resin. A preferred example of a UV curable type resin for the adhesive is, e.g., urethane acrylate oligomer.

Further, the adhesive may be, for example, a water soluble resin.

The wafer dividing method of the invention may further comprise applying plasma etching to the side of the wafer being opposite to the one side after cutting the wafer. In this way, any mechanical damage caused in the wafer by the cutting process can be removed, thus relieving mechanical stress generated in the wafer during cutting thereof and enhancing the die strength of the resulting device chips.

Plasma etching may be applied to the side of the wafer being opposite to the one side after the application of the protective layer. In this way, the protective layer serves as a mask during plasma etching, protecting the wafer backside from the plasma and efficiently guiding the plasma into the cuts between the dies created in the cutting process, thus reliably etching the side surfaces of the dies.

The wafer dividing method of the invention may further comprise attaching an adhesive pick-up tape to the side of the wafer being opposite to the one side after cutting the wafer.

This step allows for a particularly easy detachment of the carrier from the adhesive tape and the adhesive tape from the one side of the wafer since the dies are held by the adhesive pick-up tape.

The adhesive pick-up tape may further be configured to be radially expandable or stretchable. The method may further comprise a step of radially expanding the adhesive pick-up tape, e.g., by use of an expansion drum, to increase the distances between dies and allowing an easier die pick-up.

The wafer dividing method of the invention may further comprise parallelizing the surface of the adhesive tape opposite the surface facing the one side of the wafer with the surface of the wafer opposite the one side. In this way, a higher processing precision, also leading to an increased processing quality, can be achieved.

The carrier may be made of a rigid material, such as silicon and/or glass. If the carrier is made of glass, energy input into the attachment means is possible with radiation that is transmittable through glass, for instance UV radiation. If the carrier is made of silicon, a cost-efficient carrier is provided. Also a combination of the two materials is possible.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods for dividing a wafer W into dies.

The wafer W can be, for example, a MEMS wafer having MEMS devices formed on a front side surface thereof, which is called a pattern side 1 in the following description. However, the wafer H is not limited to a MEMS wafer, but may also be a CMOS wafer having CMOS devices, preferably as solid-state imaging devices, formed on the pattern side 1 thereof or a wafer with other types of devices on the pattern side 1.

The wafer W may be made of a semiconductor, e.g., silicon. Such a silicon wafer H can include devices such as ICs (integrated circuits) and LSIs (large scale integrations) on a silicon substrate. Alternatively, the wafer may be an optical device wafer configured by forming optical devices such as LEDs (light emitting diodes) on an inorganic material substrate of, for example, ceramic, glass or sapphire. The wafer W is not limited to this and can be formed in any other way. Furthermore, also a combination of the above described exemplary wafer designs is possible.

The wafer H can have a thickness before grinding in the µm range, preferably in the range of 625 to 925 µm.

The wafer W preferably exhibits a circular shape. The wafer W is provided with a plurality of crossing division lines (not shown), called streets, formed on the pattern side 1 thereof, thereby partitioning the wafer W into a plurality of rectangular regions where devices, such as those described previously, are respectively formed. These devices are formed in a device area 2 of the wafer W. In the case of a circular wafer W, this device area 2 is preferably circular and arranged concentrically with the outer circumference of the wafer W. The device area 2 is surrounded by an annular peripheral marginal area 3 surrounding the device area 2. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The pattern side 1 of the wafer W is further provided with fragile structures or bumps 14 for establishing an electrical contact with the devices of the device area 2 in the separated dies.

In the following, a method of dividing a wafer W according to a first embodiment of the present invention will be described with reference to FIGS. 1 to 13.

Figure 1:
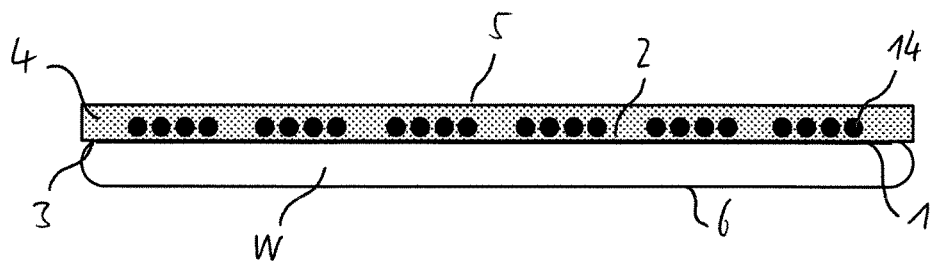
FIG. 1 is a cross-sectional view illustrating a first step of a method of dividing a wafer according to a first embodiment of the present invention.

FIG. 1 depicts the outcome of a first step of the method of dividing a wafer according to the first embodiment of the present invention. In this first step, an adhesive tape 4 is attached to the pattern side 1 of the wafer W. In other words, the pattern side 1 is laminated with the adhesive tape 4. The adhesive tape 4 preferably has the same shape as the wafer W and is attached thereto concentrically. When attached to the wafer W, the adhesive tape 4 adheres to the devices formed in the device area 2 of the pattern side 1.

The adhesive tape 4 allows for protection of the devices formed in the device area 2 of wafer W.

The adhesive of the adhesive tape 4 on the side thereof facing the pattern side 1 of the wafer W may be curable by an external stimulus, such as heat, UV radiation, an electric field and/or a chemical agent. In this way, the adhesive tape 4 can be easily removed from the wafer W after processing.

In particular, the adhesive of the adhesive tape 4 may be an acrylic resin or an epoxy resin. A preferred example of a UV curable type resin for the adhesive is, e.g., urethane acrylate oligomer. Further, the adhesive may be, for example, a water soluble resin.

Figure 2:
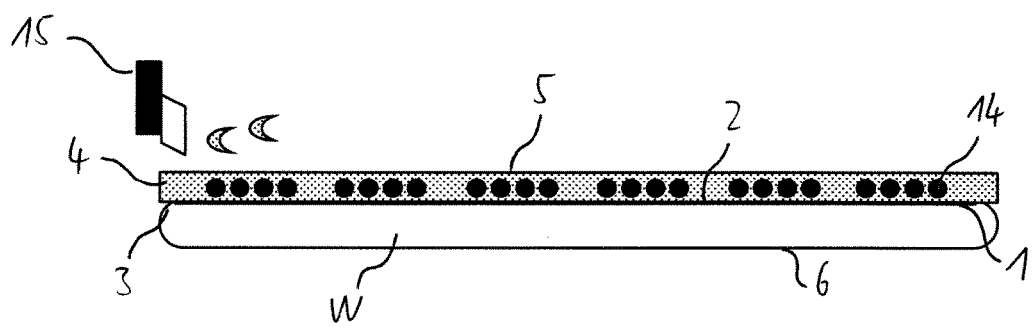
FIG. 2 is a cross-sectional view illustrating a second step of the method of dividing a wafer according to the first embodiment of the present invention.

FIG. 2 illustrates a second step of the method of dividing a wafer according to the first embodiment of the present invention. It is to be noted that this second step is optional for the method according to this first embodiment. In this second step, the surface of the adhesive tape 4, which is oriented away from the wafer W, is parallelized to the surface of the wafer W, which is oriented away from the adhesive tape 4. Due to the fact that the devices are formed on the pattern side 1 of wafer W, the top surface 5 of the adhesive tape 4 might exhibit an uneven surface profile due to the devices formed below it. The distance between the lowest point of this top surface 5, which is the point of the surface that is closest to the wafer W, and the highest point of this top surface 5, which is the point that is the most far away from the wafer W, can be around 70 μm. Through the parallelization in this second step, this distance can be, for example, reduced to approximately 2 μm. The parallelization can be preferably achieved by chucking the wafer W on a chuck table and moving a milling device 15 along the top surface 5 such that the machining plane of the milling device 15 is oriented in parallel to the backside surface 6 of wafer W. The total thickness value of the wafer W with the laminated adhesive tape 4 can be significantly improved by this second step.

Figure 3:
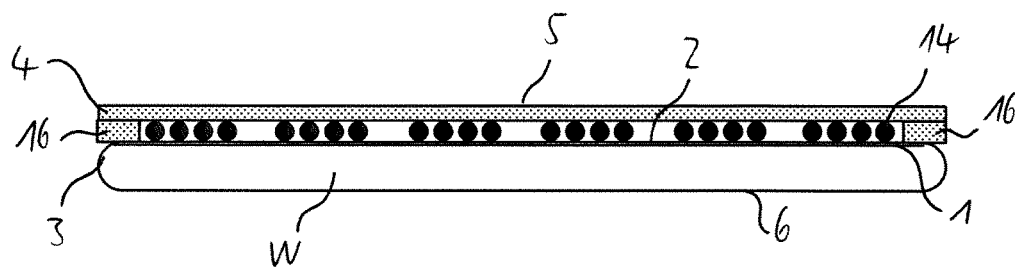
FIG. 3 is a cross-sectional view illustrating an alternative first step of the method of dividing a wafer according to the first embodiment of the present invention.

FIG. 3 illustrates an alternative first step of the method of dividing a wafer according to the first embodiment of the present invention. In this alternative first step, a different type of adhesive tape 4 is attached to the wafer W. The adhesive 16 of this adhesive tape 4 on the side thereof facing the pattern side 1 of the wafer W is arranged in an annular shape and located completely outward of the device area 2 of the wafer W in a top view thereon. The adhesive 16 does not extend beyond the peripheral marginal area 3 of the wafer W.

Figure 4:
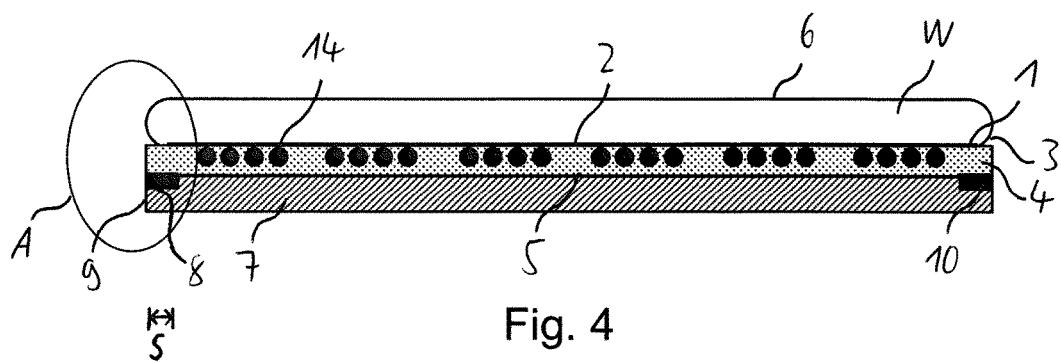
FIG. 4 is a cross-sectional view illustrating third, fourth and fifth steps of the method of dividing a wafer according to the first embodiment of the present invention.
Figure 5:
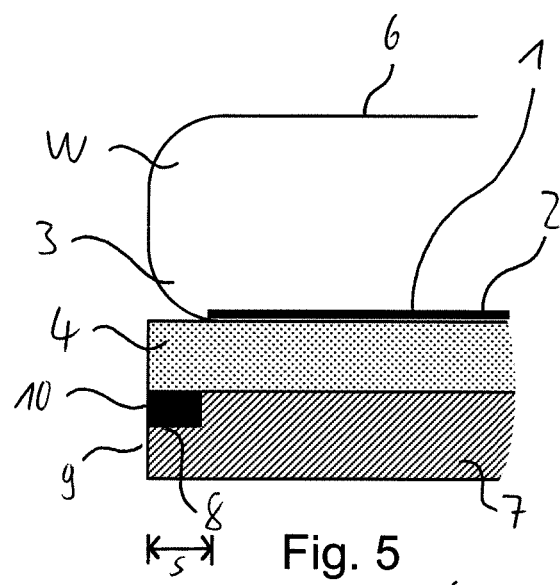
FIG. 5 is an enlarged view of the region A in FIG. 4.

FIGS. 4 and 5 show the outcome of third, fourth and fifth steps of the method of dividing a wafer according to this first embodiment.

In the third step, a hard carrier 7 is provided. The hard carrier 7 is preferably made of a material that is significantly harder and more rigid than the material of the adhesive tape 4. The hard carrier 7 is for instance made of silicon, glass or a combination thereof. Preferably, the hard carrier 7 is formed congruently with and is arranged concentrically to the adhesive tape 4, as is illustrated in FIG. 4. The hard carrier 7 may, for example, exhibit a height of 500 to 1000 82 m.

In the fourth step, which is optional for this first embodiment, an annular recess 8, for instance a notch, is formed concentrically in the hard carrier 7, as is illustrated in FIGS. 4 and 5. Preferably, the annular recess 8 has a rectangular profile in cross section and/or extends from the outer peripheral surface 9 of the hard carrier 7 radially inward. In the height direction of the hard carrier 7, the recess 8 can extend along approximately half of the carrier height.

The hard carrier 7 exhibits an outer annular portion s, which extends from the outer circumference 9 of the wafer W radially inward. The annular portion s corresponds to the peripheral marginal area 3 of the wafer W, when the hard carrier 7 is attached concentrically to the adhesive tape 4. The extension and arrangement of the recess 8 is defined as being within the outer annular portion s. Accordingly, when the hard carrier 7 is attached concentrically to the adhesive tape 4, the recess 8 does not extend in the device area 2 of the wafer W in a top view thereon, as is illustrated in FIGS. 4 and 5. It is to be noted that the recess 8 can also start from a radial position that is shifted radially inward from the outer circumference 9 of the hard carrier 7. Further, profiles different from a rectangular profile are possible, for instance, a triangular profile or a semicircular profile etc.

In the fifth step of this first embodiment, the hard carrier is concentrically attached to the top surface 5 of the adhesive tape 4. Due to the fact that hard carrier 7 and adhesive tape 4 are formed congruently, these two parts form a continuous circumferential surface. The attachment of hard carrier 7 to adhesive tape 4 is achieved by an attachment means 10, which allows for a later detachment of hard carrier 7 from adhesive tape 4 without damage to the hard carrier 7.

The attachment means 10 can exhibit adhesive characteristics that can be influenced, by the application of energy, for instance UV-radiation. The attachment means 10 can comprise UV-curable glue, preferably in form of a double-sided adhesive tape. The attachment means 10 is provided in the recess 8 of the hard carrier 7 for attaching the hard carrier 7 to the adhesive tape 4. Due to the configuration of the recess 8, the attachment means 10 is entirely situated within the peripheral marginal area 3 of the wafer W, thereby not extending into the device area 2, as is illustrated in FIGS. 4 and 5.

The wafer W, the adhesive tape 4 and the hard carrier 7 after this fifth step form a unit with constant, or approximately constant, diameter. This unit, and especially the adhesive tape 4, is structurally supported by the rigid hard carrier 7, which is attached to the adhesive tape 4 with the UV-curable glue of the attachment means 10 provided in the recess 8. When UV-curable glue is used for the attachment means 10, the hard carrier 7 is preferably made of glass. This allows for UV-radiation to penetrate through the carrier 7 to cure the glue in the recess 8, such that the glue loses its adhesive characteristics and the carrier 7 can be easily detached without being damaged.

Alternatively, instead of the UV-curable glue, a heat-curable adhesive tape, preferably a double-sided adhesive tape, can be used for the attachment means 10 for attaching the hard carrier 7 to the adhesive tape 4. This tape is preferably arranged in the recess 8 of the hard carrier 7. Such a heat-curable adhesive tape allows for an easy detachment of the hard carrier 7 from the adhesive tape 4 by applying heat to the heat-curable adhesive tape without damage of the carrier 7. This configuration allows for the use of silicon as a material for the hard carrier 7 since no transparency thereof is needed. Alternatively, water-soluble glue can be used for the attachment means 10.

It is also possible that dispensed liquid glue is used for the attachment means 10. The liquid glue will dry and connect the adhesive tape 4 and the hard carrier 7 to each other. This glue can be arranged in the recess 8. The recess 8 can be provided at the circumferential surface of the adhesive tape 4, the circumferential surface of the hard carrier 7 or within both. The liquid glue can then be provided at the interface of the adhesive tape 4 and the hard carrier 7 within the recess. The recess 8 can exhibit a triangular cross section.

It is also possible that no recess is provided, as will be further detailed in the following with reference to FIGS. 6 and 7 which show alternative arrangements of the attachment means 10.

Figure 6:
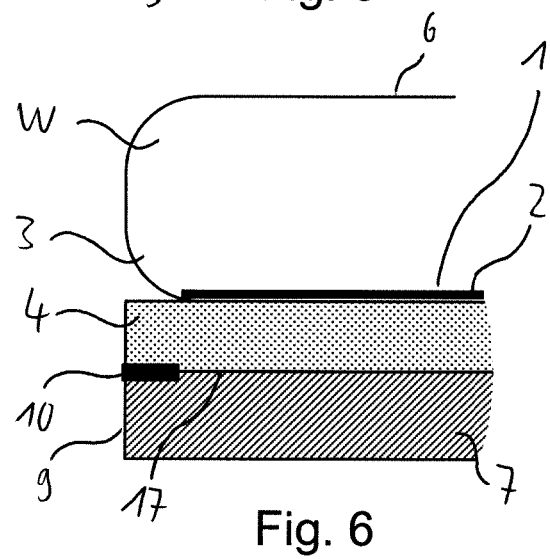
FIG. 6 is an enlarged view of the region A in FIG. 4 for an alternative arrangement of the attachment means.

As is schematically illustrated in FIG. 6, the attachment means 10 may be provided in an annular arrangement on a flat upper surface 17 of the carrier 7. Such an arrangement offers a particularly simple structure of the carrier 7 and the attachment means 10, since no recesses have to be provided. The attachment means 10 may have a thickness in the range of 5 to 100 μm.

Figure 7:
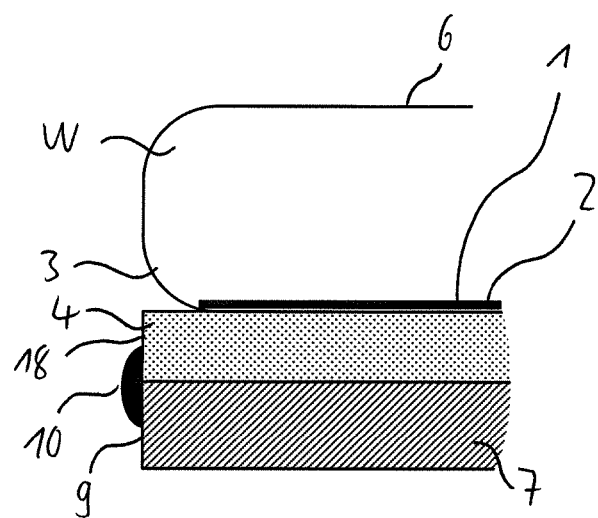
FIG. 7 is an enlarged view of the region A in FIG. 4 for another alternative arrangement of the attachment means.

Alternatively, as is schematically illustrated in FIG. 7, the attachment means 10 may be arranged on the peripheral side surface 9 of the carrier 7 and a peripheral side surface 18 of the adhesive tape 4, e.g., along the entire circumference of the carrier 7 and the adhesive tape 4. In this case, no portion of the attachment means 10 is present at the interface between carrier 7 and adhesive tape 4. Therefore, a particularly smooth, even and homogeneous interface between these two elements can be ensured.

In all of the above configurations of the attachment means 10, the attachment means 10 does not extend into the device area 2 of the wafer W.

To detach the hard carrier 7 from the adhesive tape 4, a knife or any other mechanical cutting devices can be used for cutting the attachment means 10 to detach the hard carrier 7 from the adhesive tape 4 without damage. Alternatively, a glue, such as a liquid glue, used for the attachment means 10 may be curable by an external stimulus, such as UV radiation or heat. In this case, the hard carrier 7 can be detached from the adhesive tape 4 by applying the external stimulus to the glue, thereby curing the glue and thus lowering its adhesive force, and subsequently removing the hard carrier 7 from the adhesive tape 4. Further, the glue, such as a liquid glue, may be a water soluble glue, allowing for the hard carrier 7 to be removed from the adhesive tape 4 by applying water to the glue.

Figure 8:
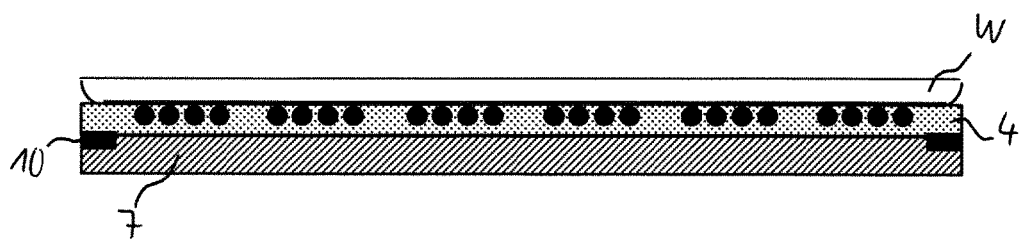
FIG. 8 is a cross-sectional view illustrating a sixth step of the method of dividing a wafer according to the first embodiment of the present invention.

FIG. 8 illustrates the outcome of a sixth step of this first embodiment. In this sixth step, the wafer W, to which the adhesive tape 4 has been attached, wherein the hard carrier 7 is mounted to the adhesive tape 4, is ground from its backside surface 6 with a grinding device to a desired thickness. The thickness can be the final thickness of the dies. Such a grinding device can include one or more grinding wheels, such as diamond wheels.

Figure 9:
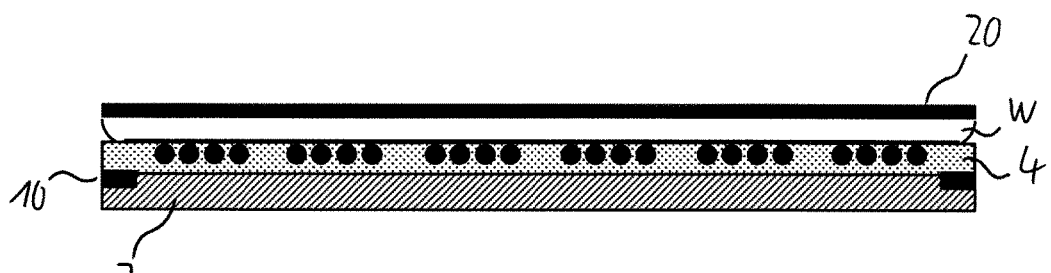
FIG. 9 is a cross-sectional view illustrating a seventh step of the method of dividing a wafer according to the first embodiment of the present invention.

In a seventh step of this first embodiment, a protective layer 20 is applied to the backside of the wafer W after grinding, as is illustrated in FIG. 9.

The protective layer 20 may be applied, for example, in the form of a solid sheet, e.g., an adhesive tape, or in the form of a liquid mold material.

In the first embodiment of the wafer dividing method of the invention, the protective layer 20 is preferably applied in the form of a solid sheet, namely a tape, having applied thereto a material which is curable by an external stimulus, such as heat, UV radiation, an electric field and/or a chemical agent. In particular, the tape may have applied thereto a thermosetting material and/or an energy ray-curable material. For example, the Adwill LC Tape manufactured by the LINTEC Corporation may be used as the protective layer 20.

The protective layer 20 is cured by applying the external stimulus thereto, e.g., by heating in an oven for the case of a heat curable, e.g., thermosetting, material.

This approach allows for a particularly high degree of accuracy and uniformity of the protective layer 20 to be achieved.

Figure 10:
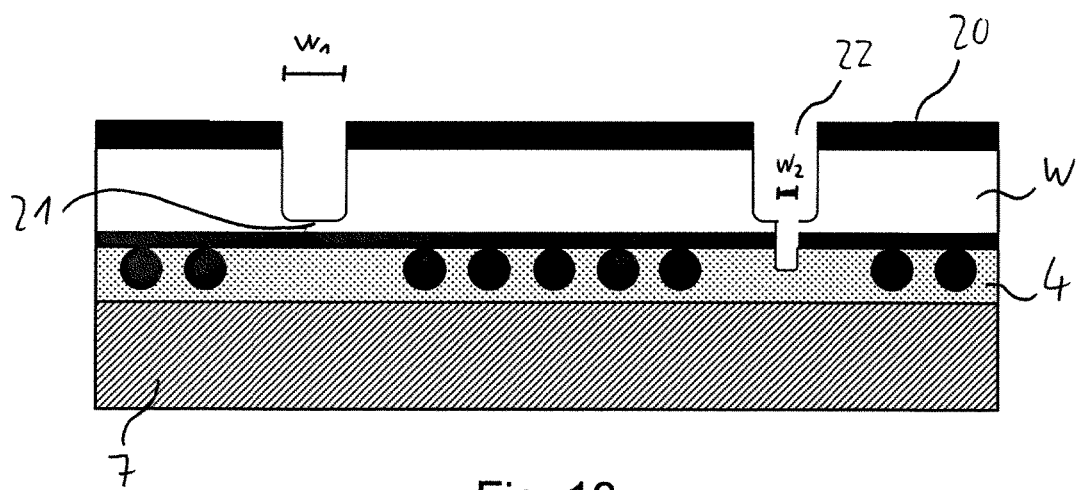
FIG. 10 is a cross-sectional view illustrating eighth and ninth steps of the method of dividing a wafer according to the first embodiment of the present invention.

In eighth and ninth steps of the wafer dividing method of the first embodiment, the wafer W is cut along the division lines from the ground backside thereof, as is illustrated in FIG. 10.

Specifically, the ground backside of the wafer W is first mechanically partially cut with a first cutting width $w_1$ (see the left-hand side of FIG. 10, schematically showing a partial cut) using a mechanical cutting device, such as a blade or a saw. As is schematically shown in FIG. 10, the wafer W is mechanically cut along more than 80% of its thickness. The mechanical cut is performed along the division lines through the protective layer 20 before being performed through part of the wafer W.

Subsequently, a remaining part 21 of the wafer W, in the thickness direction thereof in the regions where the partial cuts had been formed, is mechanically cut and/or cut by laser and/or cut by plasma from the backside of the wafer 81 with a second cutting width $w_2$ (see the right-hand side of FIG. 10, schematically showing a cut 22 reaching through the entire thickness of the wafer W).

As is shown in FIG. 10, the second cutting width $w_2$ is smaller than the first cutting width $w_1$.

In this first embodiment, the remaining part 21 of the wafer W is preferably cut by laser. However, alternatively, the remaining part 21 of the wafer W may be mechanically cut, for example, by using a mechanical cutting device, such as a blade or a saw, with a width which is smaller than that of the mechanical cutting device used for the partial cuts. Moreover, as a further alternative, the remaining part 21 of the wafer W may be cut by plasma, e.g., by using a plasma source. Further, also combinations of these different cutting methods may be used.

By cutting the remaining part 21 of the wafer W, the dies 23 are fully separated from each other.

The method of the invention is especially advantageous if the wafer W exhibits a surface layer (not shown), in particular, a low-k layer, on its pattern side 1. Low-k layers are generally very brittle and are easily damaged and/or delaminated when cutting the wafer W from the pattern side 1 thereof. However, when dividing such a wafer W using the method of the invention, no such damage and/or delamination occurs, since the wafer W is cut from the backside thereof in the manner specified above.

Figure 11:
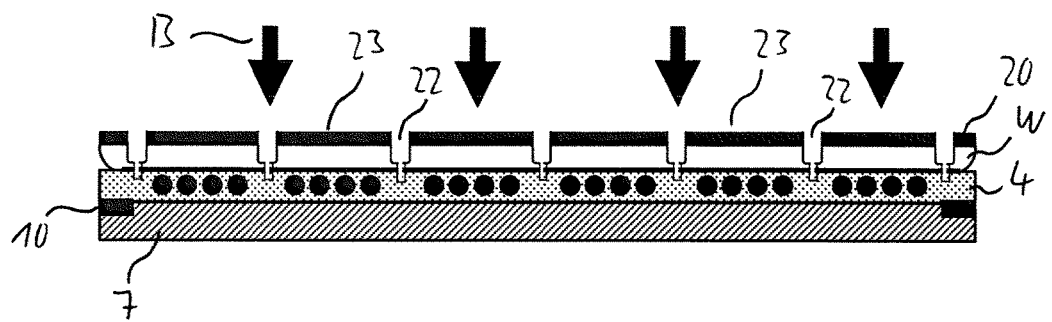
FIG. 11 is a cross-sectional view illustrating a tenth step of the method of dividing a wafer according to the first embodiment of the present invention.

After the dies 23 have been completely separated from one another, they respectively adhere to the adhesive tape 4, to which the hard carrier 7 is attached, as illustrated in FIG. 11. In a tenth step of the first embodiment, plasma etching is applied to the wafer backside after cutting the wafer W, as is indicated by arrows B in FIG. 11. In this way, any mechanical damage caused in the wafer W by the cutting process can be removed, thus relieving mechanical stress generated in the wafer W during cutting thereof and enhancing the die strength of the resulting device chips. In the plasma etching process, the protective layer 20 serves as a mask, protecting the wafer backside from the plasma and efficiently guiding the plasma into the cuts 22 between the dies 23 created in the cutting process, thus reliably etching the side surfaces of the dies 23.

Figure 12:
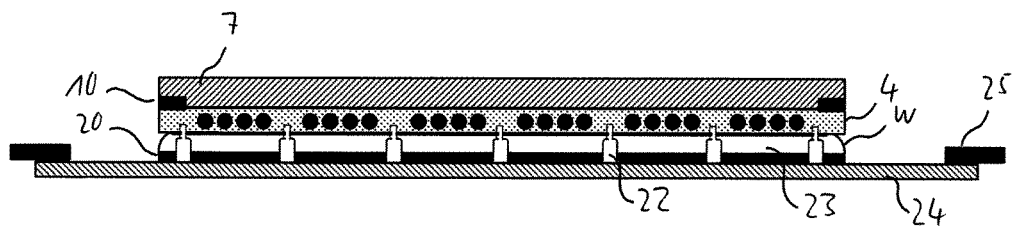
FIG. 12 is a cross-sectional view illustrating an eleventh step of the method of dividing a wafer according to the first embodiment of the present invention.

In an eleventh step of the first embodiment, the outcome thereof being shown in FIG. 12, the individual dies 23, respectively held by the adhesive tape 4 and the hard carrier 7, are placed on an adhesive pick-up tape 24 mounted on an annular frame 25. The unit of dies 23, adhesive tape 4 and hard carrier 7 is placed on the adhesive pick-up tape 24 in such a way that the upper surface of the protective layer 20 contacts the adhesive pick-up tape 24, as is shown in FIG. 12.

Figure 13:
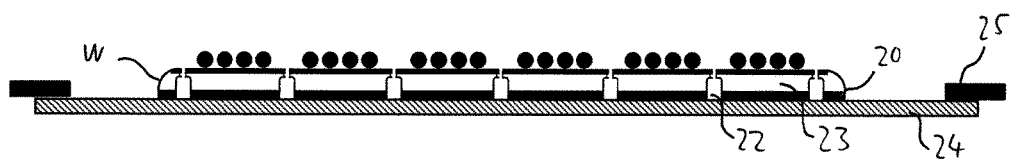
FIG. 13 is a cross-sectional view illustrating a twelfth step of the method of dividing a wafer according to the first embodiment of the present invention.

In a twelfth step of the first embodiment, the result of which is shown in FIG. 13, the carrier 7 and the adhesive tape 4 are removed from the wafer W. In particular, the adhesive of the adhesive tape 4 on the side thereof facing the pattern side 1 of the wafer W may be cured by applying an external stimulus thereto, as has been detailed above, so as to lower the adhesive force of the adhesive, thus allowing for an easy removal of the adhesive tape 4 and the carrier 7 from the wafer W.

Subsequently, the individual separated dies 23 can be picked up from the adhesive pick-up tape 24 by a pick-up device. The spacing between the individual dies 23 can be increased by radially stretching the pick-up tape 24 in order to facilitate the pick-up process.

In the following, a method of dividing a wafer W according to a second embodiment of the present invention will be described with reference to FIGS. 14 to 17. The method of the second embodiment differs from the method of the first embodiment in the seventh to tenth method steps illustrated in FIGS. 14 to 17.

Figure 14:
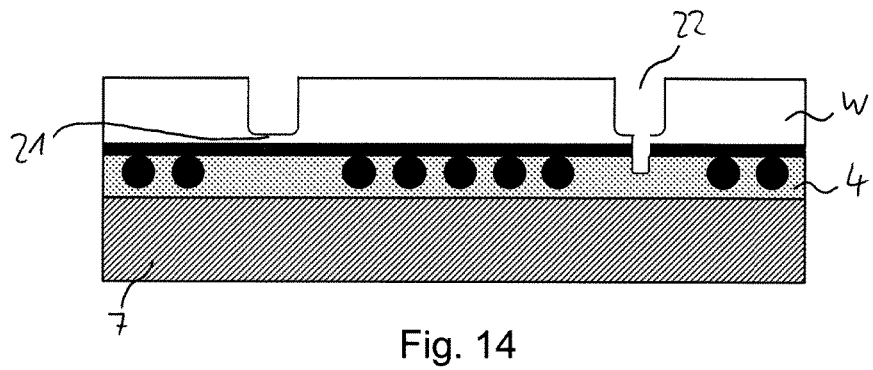
FIG. 14 is a cross-sectional view illustrating seventh and eighth steps of the method of dividing a wafer according to a second embodiment of the present invention.

Specifically, as is shown in FIG. 14, in the method of the second embodiment, the cutting of the wafer W is performed in seventh and eighth steps prior to the application of the protective layer 20.

Figure 15:
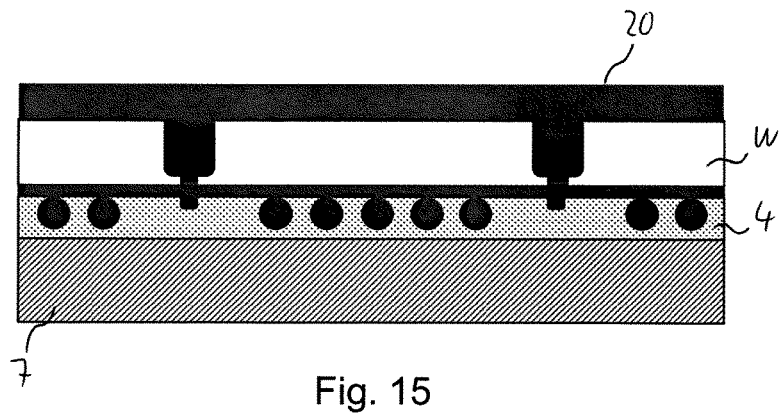
FIG. 15 is a cross-sectional view illustrating a ninth step of the method of dividing a wafer according to the second embodiment of the present invention.

Subsequently, as is schematically shown in FIG. 15, a liquid mold material for the protective layer is applied to the backside of the wafer W in a ninth step. The liquid mold material penetrates into the cuts 22 between the dies 23 created in the cutting process. Hence, the protective layer 20 can be reliably applied also to the side surfaces of the dies 23, thus providing particularly reliable protection.

The liquid mold material is curable by an external stimulus, such as heat, UV radiation, an electric field and/or a chemical agent. After the liquid mold material for the protective layer 20 has been applied to the backside of the wafer W, it is cured by applying the external stimulus thereto, e.g., by heating in an oven for the case of a heat curable, e.g., thermosetting, material.

Optionally, after curing, protective layer 20 may be subjected to a grinding process for rendering the top surface of the protective layer 20 particularly flat and even.

Figure 16:
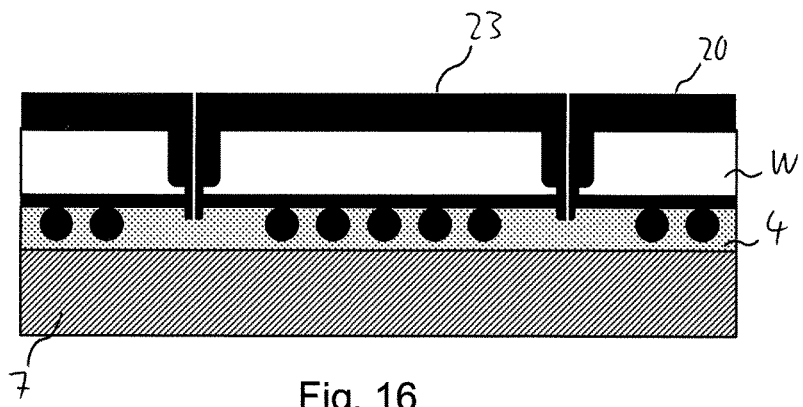
FIG. 16 is a cross-sectional view illustrating a tenth step of the method of dividing a wafer according to the second embodiment of the present invention.

In a tenth step of the second embodiment, which is schematically shown in FIG. 16, the protective layer 20 is cut along lines at the location where the division lines were located before cutting the wafer W. In this way, the dies 23 having the protective layer 20 applied to their backsides and side surfaces are reliably separated from each other. This cutting process may be performed, for example, by mechanical cutting, e.g., using a blade or a saw, and/or cutting by laser and/or cutting by plasma.

Optionally, a laser marking may be provided on the protective layer 20.

Figure 17:
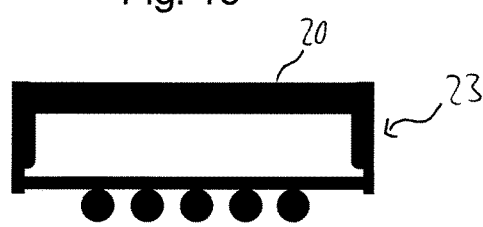
FIG. 17 is a cross-sectional view showing a separated die obtained by the method of dividing a wafer according to the second embodiment of the present invention.

Subsequently, the separated dies 23 can be picked up in the same manner as detailed above for the first embodiment. An individual separated die 23 obtained by the method of the second embodiment is shown in FIG. 17.

Figure 18:
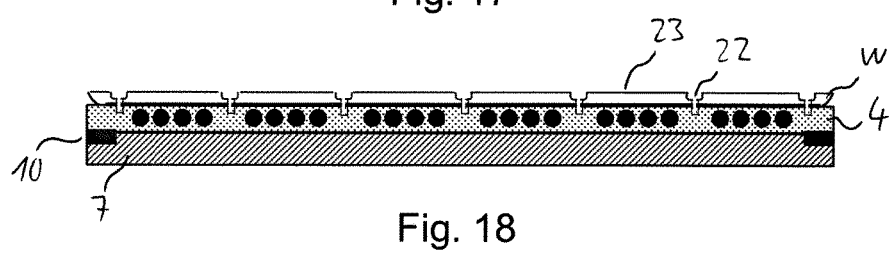
FIG. 18 is a cross-sectional view illustrating an eleventh step of the method of dividing a wafer according to a third embodiment of the present invention.

In the following, a method of dividing a wafer W according to a third embodiment of the present invention will be described with reference to FIGS. 18 to 20. The method of the third embodiment substantially differs from the method of the first embodiment in the eleventh to thirteenth method steps illustrated in FIGS. 18 to 20.

Specifically, in the method of the third embodiment, the wafer W is ground in the grinding step illustrated for the first embodiment in FIG. 8. However, in this step of the third embodiment, the wafer H is not ground to its final thickness but rather pre-ground to a thickness of, for example, 200 to 400 μm.

Subsequently, a protective layer 20 is applied to the pre-ground surface of the wafer H and cured (see FIG. 9) and the wafer H is cut from the backside thereof (see FIG. 10). Further, plasma etching is applied to the wafer backside after cutting the wafer H (see FIG. 11). All of these steps are carried out in the same way as for the first embodiment.

After the plasma etching, the wafer W is subjected to a further grinding step as an eleventh step, grinding off the protective layer 20 from the wafer H and grinding the wafer H to its final desired thickness, e.g., 10 to 50 μm. The result of this grinding step is shown in FIG. 18.

After this further grinding step, a stress relief treatment may be applied to the wafer backside, for example, by polishing the backside, e.g., using a dry polishing pad.

Figure 19:
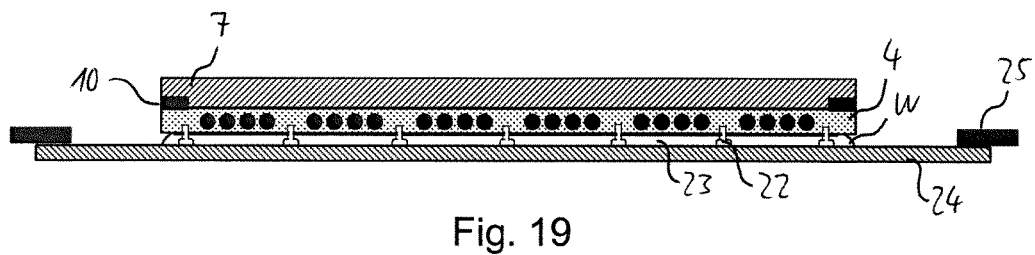
FIG. 19 is a cross-sectional view illustrating a twelfth step of the method of dividing a wafer according to the third embodiment of the present invention.

In a twelfth step of the method of the third embodiment, the outcome thereof being shown in FIG. 19, the individual dies 23, respectively held, by the adhesive tape 4 and the hard carrier 7, are placed on an adhesive pick-up tape 24 mounted on an annular frame 25. In contrast to the first embodiment, the unit of dies 23, adhesive tape 4 and hard carrier 7 is placed on the adhesive pick-up tape 24 in such a way that the ground surface of the dies 23 contacts the adhesive pick-up tape 24, as is shown in FIG. 19.

Figure 20:
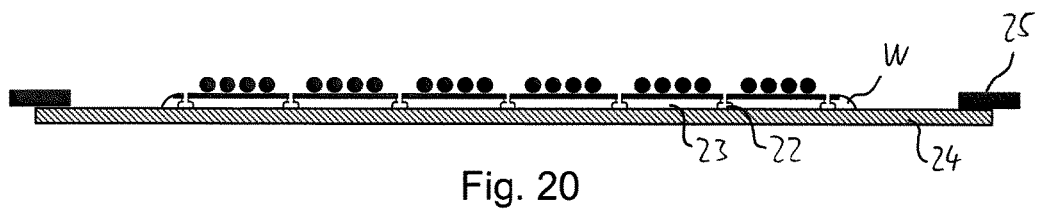
FIG. 20 is a cross-sectional view illustrating a thirteenth step of the method of dividing a wafer according to the third embodiment of the present invention.

In a thirteenth step of the third embodiment, the result of which is shown in FIG. 20, the carrier 7 and the adhesive tape 4 are removed from the wafer W. In particular, the adhesive of the adhesive tape 4 on the side thereof facing the pattern side 1 of the wafer W may be cured by applying an external stimulus thereto, as has been detailed above, so as to lower the adhesive force of the adhesive, thus allowing for an easy removal of the adhesive tape 4 and the carrier 7 from the wafer W.

Subsequently, the individual separated dies 23 can be picked up from the adhesive pick-up tape 24 by a pick-up device in the same manner as for the first and second embodiments. The spacing between the individual dies 23 can be increased by radially stretching the pick-up tape 24 in order to facilitate the pick-up process.

The invention claimed is:

1. A method of dividing a wafer, having on one side a device area with a plurality of devices partitioned by a plurality of division lines, into dies, the method comprising:
attaching an adhesive tape for protecting devices on the wafer to the one side of the wafer;
attaching a carrier for supporting the adhesive tape to the side of the adhesive tape being opposite to the side facing the one side of the wafer by an attachment means;
grinding the side of the wafer being opposite to the one side for adjusting the wafer thickness;
applying a protective layer to the side of the wafer being opposite to the one side after grinding, wherein the protective layer is plasma resistant; and
cutting the wafer along the division lines;
wherein the side of the wafer being opposite to the one side is mechanically partially cut with a first cutting width using a blade or saw,
wherein a remaining part of the wafer, in the thickness direction thereof in the region or regions where the partial cut or cuts had been formed, is mechanically cut and/or cut by laser and/or cut by plasma from the side of the wafer being opposite to the one side with a second cutting width, and
wherein the second cutting width is smaller than or equal to the first cutting width,
wherein the application of the protective layer to the side of the wafer being opposite to the one side is performed after the cutting of the wafer, such that the protective layer fills the cuts formed with both the first and second cutting widths.

2. The method according to claim 1, wherein the second cutting width is smaller than the first cutting width.

3. The method according to claim 1, wherein the attachment means is located completely outward of the device area of the wafer in a top view thereon.

4. The method according to claim 3, wherein the attachment means is arranged on a flat upper surface of the carrier or the attachment means is received in a recess, preferably an annular recess, formed in the carrier or the attachment means is arranged on a peripheral side surface of the carrier and a peripheral side surface of the adhesive tape.

5. A method of dividing a wafer, having on one side a device area with a plurality of devices partitioned by a plurality of division lines, into dies, the method comprising:
attaching an adhesive tape for protecting devices on the wafer to the one side of the wafer;
attaching a carrier for supporting the adhesive tape to the side of the adhesive tape being opposite to the side facing the one side of the wafer by an attachment means;
grinding the side of the wafer being opposite to the one side for adjusting the wafer thickness;
applying a protective layer to the side of the wafer being opposite to the one side after grinding, wherein the protective layer is plasma resistant and further wherein the protective layer comprises a material which is curable by an external stimulus; and
cutting the wafer along the division lines;
wherein the side of the wafer being opposite to the one side is mechanically partially cut with a first cutting width using a blade or saw,
wherein a remaining part of the wafer, in the thickness direction thereof in the region or regions where the partial cut or cuts had been formed, is mechanically cut and/or cut by laser and/or cut by plasma from the side of the wafer being opposite to the one side with a second cutting width,
wherein the second cutting width is smaller than or equal to the first cutting width, and
wherein the application of the protective layer to the side of the wafer being opposite to the one side is performed before cutting of the wafer.

6. The method according to claim 5, wherein the application of the protective layer to the side of the wafer being opposite to the one side is performed after cutting of the wafer.

7. The method according to claim 1, further comprising cutting the protective layer along lines at the location where the division lines were located before cutting the wafer.

8. The method according to claim 1, further comprising grinding the side of the wafer being opposite to the one side after application of the protective layer so as to remove the protective layer.

9. The method according to claim 1, wherein the protective layer is also heat resistant and/or moisture resistant.

10. The method according to claim 1, wherein the protective layer is applied in the form of a liquid mold material.

11. The method according to claim 1, wherein a low-k layer is provided on the one side of the wafer and the low-k layer is mechanically cut and/or cut by laser and/or cut by plasma from the side of the wafer being opposite to the one side.

12. The method according to claim 1, wherein an adhesive of the adhesive tape on the side thereof facing the one side of the wafer is curable by an external stimulus.

13. The method according to claim 12, further comprising applying the external stimulus to the adhesive of the adhesive tape on the side thereof facing the one side of the wafer so as to lower the adhesive force of the adhesive.

14. The method according to claim 1, further comprising applying plasma etching to the side of the wafer being opposite to the one side after cutting the wafer.

15. The method according to claim 5, wherein a mechanical cut is performed along the division lines through the protective layer before being performed through part of the wafer.

16. The method according to claim 5, wherein the second cutting width is smaller than the first cutting width.

17. The method according to claim 5, wherein the attachment means is located completely outward of the device area of the wafer in a top view thereon.

18. The method according to claim 17, wherein the attachment means is arranged on a flat upper surface of the carrier or the attachment means is received in a recess, preferably an annular recess, formed in the carrier or the attachment means is arranged on a peripheral side surface of the carrier and a peripheral side surface of the adhesive tape.

19. The method according to claim 5, further comprising grinding the side of the wafer being opposite to the one side after application of the protective layer so as to remove the protective layer.

20. The method according to claim 5, wherein the protective layer is applied in the form of a solid sheet.

* * * * *